(12) United States Patent
Yang (10) Patent No.: US 7,782,699 B2
(45) Date of Patent: Aug. 24, 2010

(54) AUTO-REFRESH CONTROLLING APPARATUS

(75) Inventor: Jong Yeol Yang, Guri-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 113 days.

(21) Appl. No.: 12/150,388

(22) Filed: Apr. 28, 2008

(65) Prior Publication Data

US 2009/0154276 A1 Jun. 18, 2009

(30) Foreign Application Priority Data

Dec. 18, 2007 (KR) ...................... 10-2007-0133637

(51) Int. Cl.
*G11C 7/22* (2006.01)
(52) U.S. Cl. ...................... 365/222; 365/201
(58) Field of Classification Search .................. 365/222
See application file for complete search history.

(56) References Cited

U.S. PATENT DOCUMENTS

| 7,215,588 B2 | 5/2007 | Lee |
| 7,248,526 B2 | 7/2007 | Ito et al. |
| 2002/0080674 A1* | 6/2002 | Dobler et al. ............... 365/222 |
| 2002/0191466 A1* | 12/2002 | Hwang et al. ............... 365/222 |
| 2005/0135171 A1* | 6/2005 | Kim .......................... 365/222 |

FOREIGN PATENT DOCUMENTS

| JP | 09-007367 | 1/1997 |
| KR | 2000-0073000 A | 12/2000 |
| KR | 10-2005-0094998 A | 9/2005 |
| KR | 10-2006-0072984 A | 6/2006 |

* cited by examiner

*Primary Examiner*—Huan Hoang
*Assistant Examiner*—Jay Radke
(74) *Attorney, Agent, or Firm*—John P. White; Cooper & Dunham LLP

(57) ABSTRACT

An auto-refresh control apparatus is provided which includes a counter unit for outputting counter signals in response to an external auto-refresh command signal, and a refresh command signal generating unit for generating internal auto-refresh command signals in response to the counter signals when a test mode signal is activated.

23 Claims, 6 Drawing Sheets

AUTO-REFRESH CONTROLLING APPARATUS

BACKGROUND

The present disclosure relates to a semiconductor memory device. More particularly, the present disclosure relates to an auto-refresh control apparatus.

In general, a DRAM periodically performs refresh in order to preserve cell data. Such a refresh increases current consumption as the integration degree of a DRAM increases.

Such a refresh is classified as auto-refresh for performing refresh by an external command and self-refresh for performing refresh by an internal command generated in a chip.

In the self-refresh, refresh can be optimally applied to a device by a refresh period. In the auto-refresh, refresh is performed without a special control scheme when an external auto-refresh command is generated.

The two types of refreshes are performed in order to preserve cell data. However, since the auto-refresh performs refresh by an external command, current consumption increases as compared with the self-refresh.

BRIEF SUMMARY

In an aspect of the present disclosure, an auto-refresh control apparatus is provided which is capable of reducing current consumption by controlling an auto-refresh command signal input from an exterior.

In one embodiment, an auto-refresh control apparatus comprises a counter unit for outputting counter signals in response to an external auto-refresh command signal, and a refresh command signal generating unit for generating internal auto-refresh command signals in response to the counter signals when a test mode signal is activated.

In another exemplary embodiment, an auto-refresh control apparatus comprises a counter unit for outputting counter signals in response to an external auto-refresh command signal, and a refresh command signal generating unit for generating internal auto-refresh command signals in response to the counter signals when a test mode signal is activated, wherein the refresh command signal generating unit outputs the internal auto-refresh command signal having an auto-refresh period determined by the test mode signal.

According to various examples and exemplary embodiments of the present invention, the auto-refresh control apparatus can reduce current consumption due to refresh by skipping the refresh when a specific auto-refresh command signal is input.

BRIEF DESCRIPTION OF THE DRAWINGS

The above and other features and advantages of the present invention will be more apparent from the following detailed description taken in conjunction with the accompanying drawings, in which.

DESCRIPTION OF EXEMPLARY EMBODIMENTS

Hereinafter, preferred embodiments of the present invention will be described with reference to the accompanying drawings. The embodiments are for illustrative purposes only and the scope of the present invention is not limited to the exemplary embodiments.

Figure 1A:
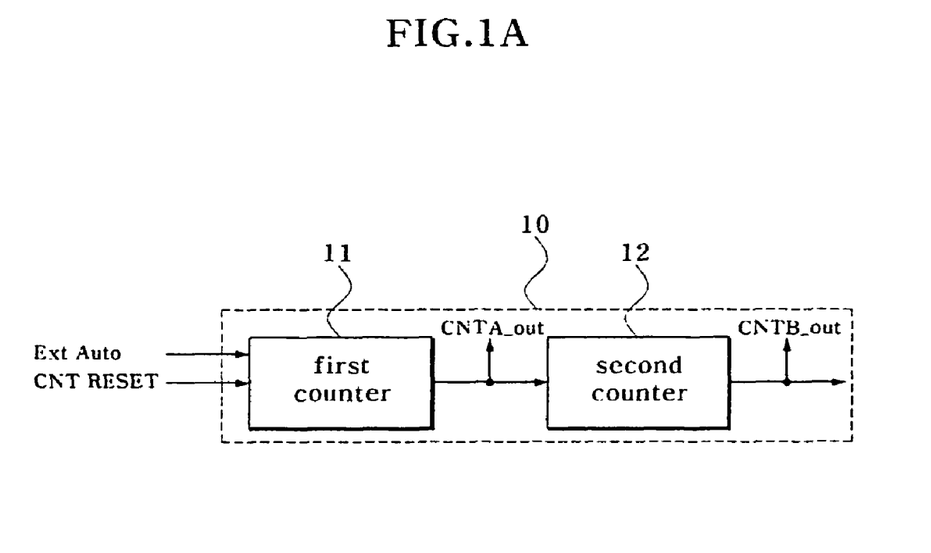
FIGS. 1a and 1b are block diagrams of an auto-refresh control apparatus according to an exemplary embodiment of the present invention.
Figure 1B:
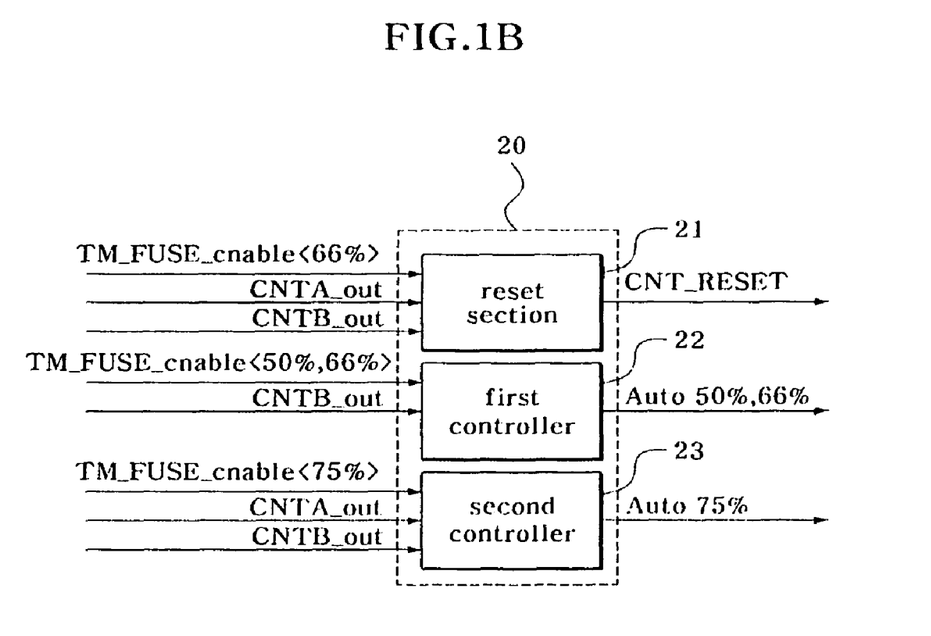
Figure 2A:
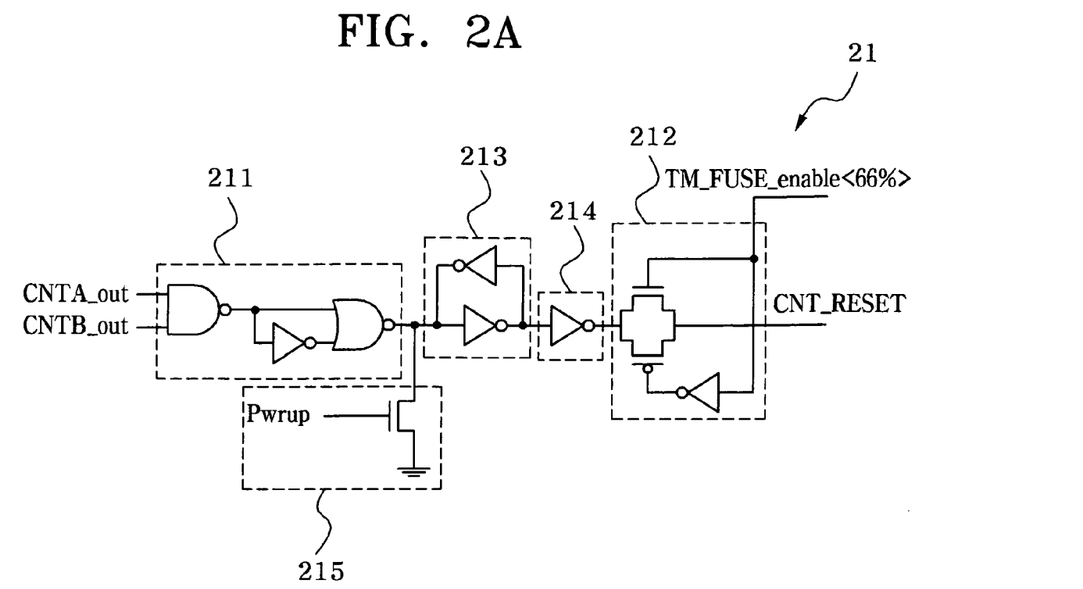
FIG. 2a is a circuit diagram of a reset section of a refresh command signal generating unit shown in FIG. 1b.
Figure 2B:
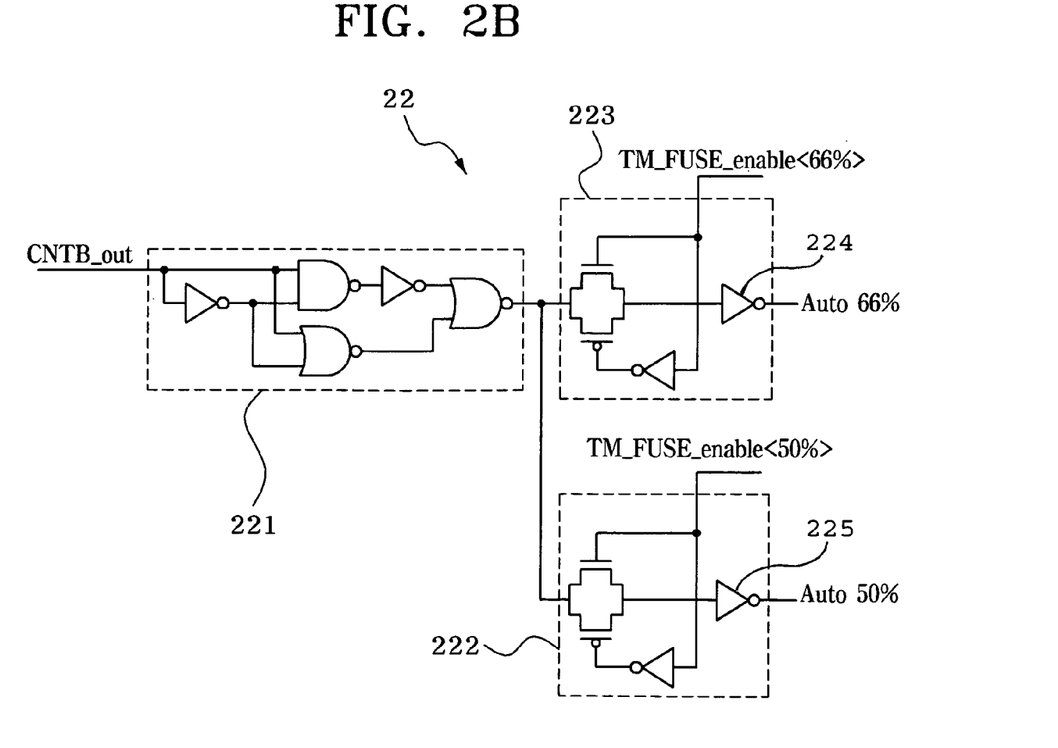
FIGS. 2b and 2c are circuit diagrams of controllers of the refresh command signal generating unit of FIG. 1b.
Figure 2C:
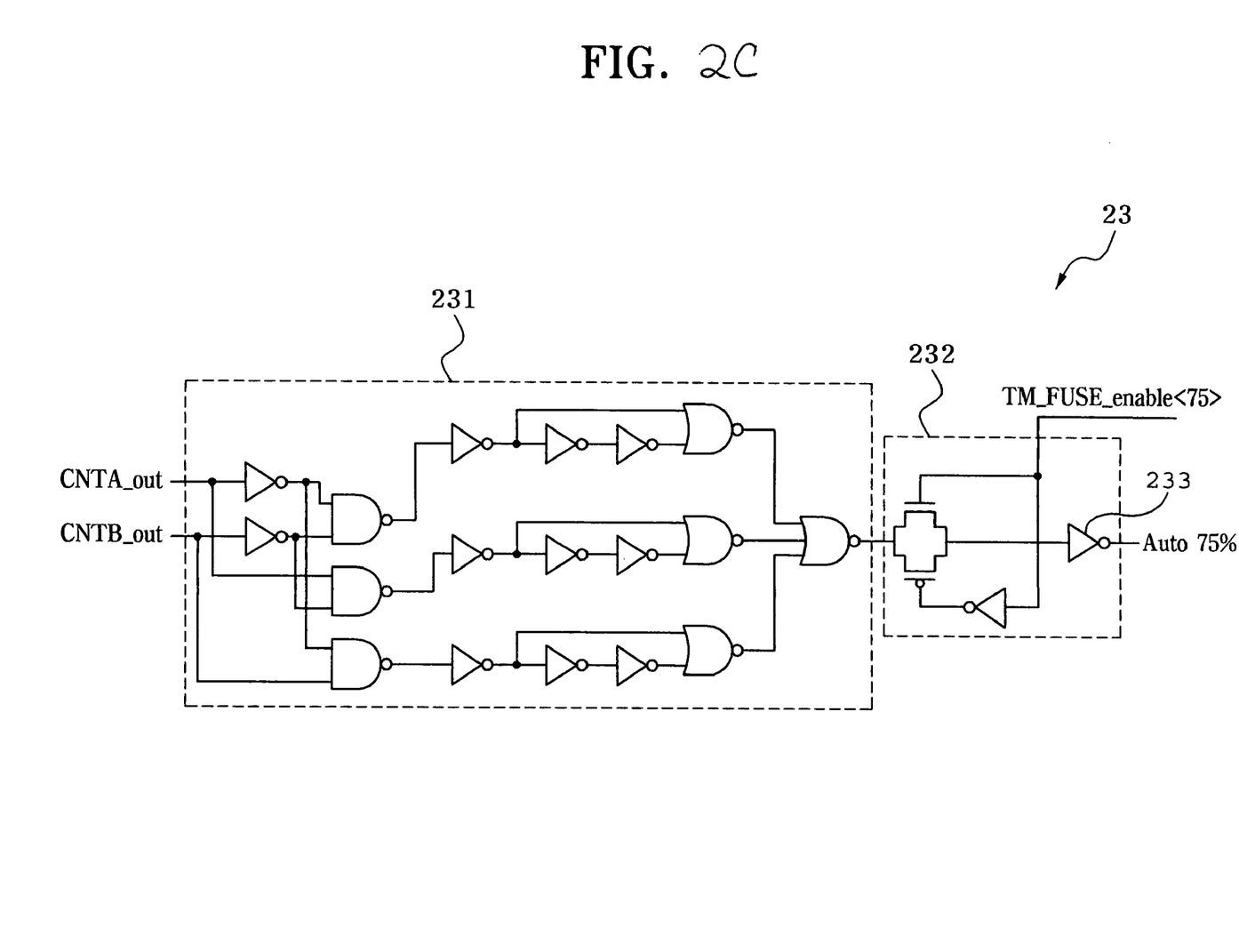

FIGS. 1a and 1b are block diagrams of an auto-refresh control apparatus according to an exemplary embodiment of the present invention, FIG. 2a is a circuit diagram of a reset section of a refresh command signal generating unit shown in FIG. 1b, FIGS. 2b and 2c are circuit diagrams of controllers of the refresh command signal generating unit of FIG. 1b, and FIGS. 3a to 3c are views illustrating the operation timing of an auto-refresh control apparatus according to an exemplary embodiment of the present invention.

The exemplary embodiment of the present invention illustrated in FIGS. 1a and 1b comprises a counter unit 10 and a refresh command signal generating unit 20. The counter unit 10 outputs counter signals CNTA_OUT and CNTB_OUT in response to an external auto-refresh command signal Ext_Auto. The refresh command signal generating unit 20 generates internal auto-refresh command signals Auto 50%, Auto 66% and Auto 75% in response to the counter signals CNTA_OUT and CNTB_OUT when test mode signals TM_FUSE_enable<50%, 66% and 75%> are activated.

The counter unit 10 comprises a first counter 11 for outputting the first counter signal CNTA_OUT in response to the external auto-refresh command signal, and a second counter 12 for outputting the second counter signal CNTB_OUT in response to the first counter signal CNTA_OUT.

The refresh command signal generating unit 20 comprises a first controller 22, a second controller 23 and a reset section 21. The first controller 22 outputs the first internal auto-refresh command signal Auto 50% in response to the second counter signal CNTB_OUT when the first test mode signal TM_FUSE_enable<50%> is activated, and outputs the second internal auto-refresh command signal Auto 66% in response to the second counter signal CNTB_OUT when the second test mode signal TM_FUSE_enable<66%> is activated. The second controller 23 outputs the third internal auto-refresh command signal Auto 75% in response to the first and second counter signals CNTA_OUT and CNTB_OUT when the third test mode signal TM_FUSE_enable<75%> is activated. The reset section 21 outputs a reset signal CNT_RESET to the counter unit 10 in response to the first and second counter signals CNTA_OUT and CNTB_OUT when the second test mode signal TM_FUSE_enable<66%> is activated.

When the external auto-refresh command signal is input to the refresh command signal generating unit 20 through the apparatus of FIG. 1A, the first test mode signal TM_FUSE_enable<50%>, the second test mode signal TM_FUSE_enable<66%> and the third test mode signal TM_FUSE_enable<75%> are activated when a refresh period is set such that refreshes of 50%, 66% and 75% are performed, respectively.

For example, the first test mode signal TM_FUSE_enable<50%> is activated when the refresh period is set such that refresh is skipped once whenever the external auto-refresh command signal Ext_Auto is input twice. The second test mode signal TM_FUSE_enable<66%> is activated when the refresh period is set such that refresh is skipped once whenever the external auto-refresh command Ext_Auto is input three times. The third test mode signal TM_FUSE_enable<75%> is activated when the refresh period is set such that refresh is skipped once whenever the external auto-refresh command signal Ext_Auto is input four times.

Whether to skip the refresh in response to the external auto-refresh command signal may be determined by the test mode signal or fuse cutting.

As illustrated in FIG. 2b, the first controller 22 comprises an operating unit 221 for performing a logic operation in response to the second counter signal CNTB_OUT, a first output unit 222 for outputting the output signal of the operating unit 221 when the first test mode signal TM_FUSE_enable<50%> is activated, and a second output unit 223 for outputting the output signal of the operating unit 221 when the second test mode signal TM_FUSE_enable<66%> is activated.

The operating unit 221 is a logic device that performs an NOR operation in response to, for example, the counter signal CNTB-OUT, and the first and second output units 222 and 223 comprise transfer gates that transfer the output signal of the operating unit 221 in response to the first and second test mode signals, respectively.

The first controller 22 further comprises a first buffer 224 and a second buffer 225 that buffer the output signals of the first and second output units 222 and 223, respectively.

As illustrated in FIG. 2c, the second controller 23 comprises an operating unit 231 for performing a logic operation in response to the first and second counter signals CNTA_OUT and CNTB_OUT, and an output unit 232 for outputting the output signal of the operating unit 231 when the third test mode signal is activated.

The operating unit 231 is a logic device that performs an NOR operation in response to the first and second counter signals CNTA_OUT and CNTB_OUT, and the output unit 232 comprises a transfer gate that transfers the output signal of the operating unit 231 in response to the third test mode signal.

The second controller 23 further comprises a buffer 233 that buffers the output signal of the output unit 232.

As illustrated in FIG. 2a, the reset section 21 comprises an operating unit 211 for performing a logic operation in response to the first and second counter signals CNTA_OUT and CNTB_OUT, and an output unit 212 for outputting the output signal of the operating unit 211 when the second test mode signal is activated.

The operating unit 211 is a logic device that performs an NOR operation in response to the first and second counter signals CNTA_OUT and CNTB_OUT, and the output unit 212 comprises a transfer gate that transfers the output signal of the operating unit 211 in response to the second test mode signal.

The reset section 21 further comprises a latch section 213 for latching the output signal of the operating unit 211, and a buffer 214 for outputting the output signal of the latch section 213 to the output unit 212 by buffering the output signal of the latch section 213.

The reset section 21 further comprises a pull-down driver 215 that pull-down drives the output terminal of the operating unit 211 in response to a power up signal Pwrup.

Hereinafter, the operation of the auto-refresh control apparatus having the construction as described above will be described in detail with reference to FIGS. 1 to 2c.

The refresh interval for preserving cell data of a DRAM is 64 ms (product standard) on the basis of a cell. In terms of word lines, the refresh is performed at a time interval obtained by dividing 64 ms by the number of word lines. For example, when the number of word lines is 4K, the refresh is performed at a time interval of 16 μs. In a case in which a product has a time interval more than 128 ms, the refresh may be performed once per two external auto-refresh command signals (more than 128 ms) or per three external auto-refresh command signals (more than 192 ms).

According to the present invention, the skip and the refresh can be selected in response to the external auto-refresh command signal according to the test mode signal or fuse cutting. Further, the skip rate can be selected based on the external auto-refresh command signals.

The refresh may be performed based on the external auto-refresh command signal as follows.

Figure 3A:
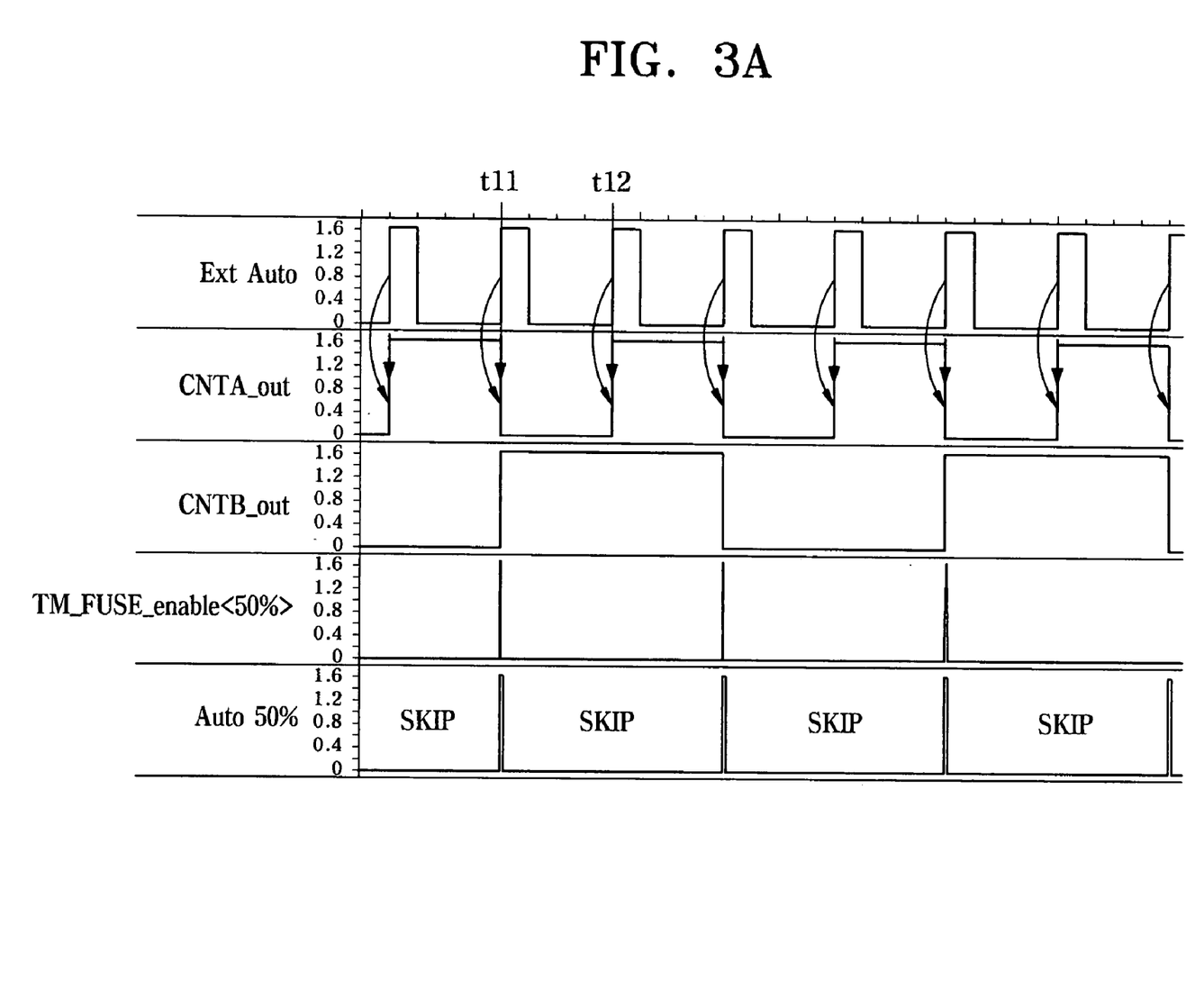
FIGS. 3a to 3c are views illustrating a operation timing of an auto-refresh control apparatus according to an exemplary embodiment the present invention.
Figure 3B:
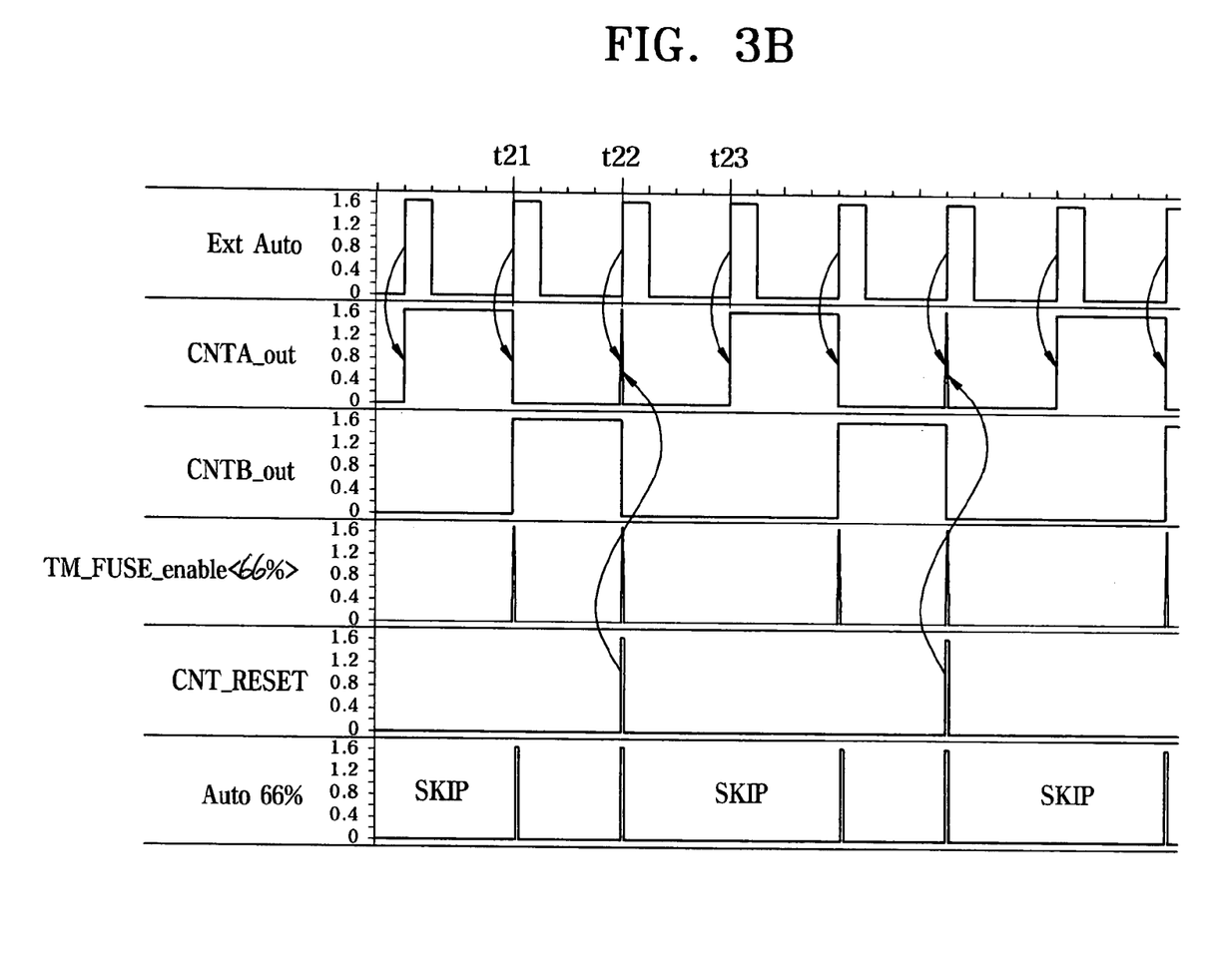
Figure 3C:
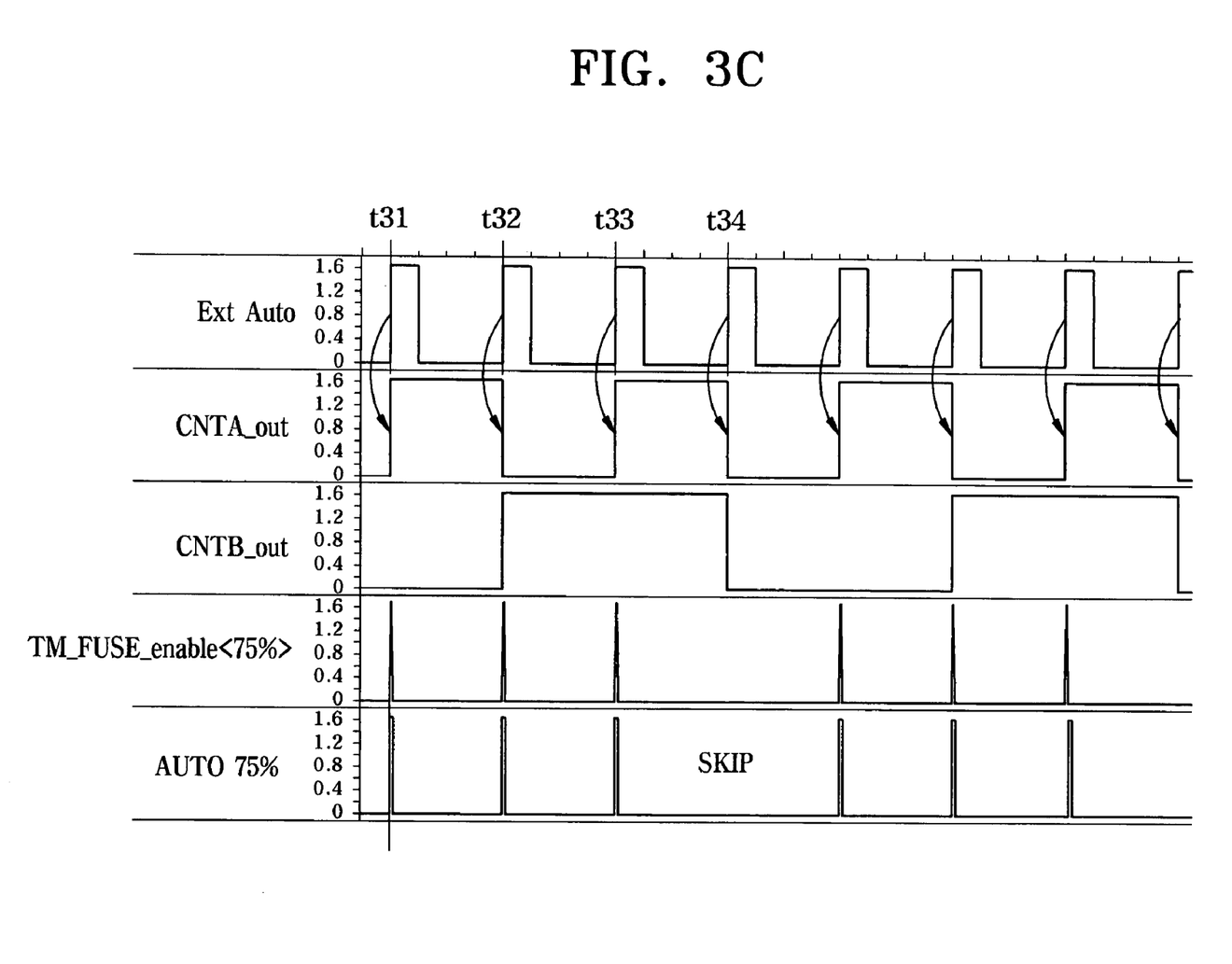

As illustrated in FIG. 3a, according to an exemplary embodiment of the present invention (refresh rate of 50%), the refresh is performed when the external auto-refresh command signal Ext Auto is activated at a first time t11. However, when the external auto-refresh command signal Ext Auto is activated at a second time t12, the refresh is skipped. As illustrated in FIG. 3b, according to another exemplary embodiment of the present invention (refresh rate of 66%), the refresh is performed when the external auto-refresh command signal Ext Auto is activated at a first time t21 and second time t22. However, when the external auto-refresh command signal Ext Auto is activated at third time t23, the refresh is skipped. As illustrated in FIG. 3c, according to another exemplary embodiment of the present invention (refresh rate of 75%), the refresh is performed when external auto-refresh command signal is activated at a first, second and third time, t31, t32 and t33, respectively. However, when the external auto-refresh command signal is activated at a fourth time t34, the refresh is skipped.

As illustrated in FIGS. 1a and 1b, the counter unit 10 outputs the first and second counter signals CNTA_OUT and CNTB_OUT whenever receiving the external auto-refresh command signal Ext_Auto.

The refresh command signal generating unit 20 generates the internal auto-refresh command signals Auto 50%, Auto 66% and Auto 75% in response to the counter signals CNTA_OUT and CNTB_OUT when the test mode signals TM_FUSE_enable<50%, 66% and 75%> are activated.

That is, the output of the counter unit 10 is input to the refresh command signal generating unit 20 to periodically skip the refresh in response to the external auto-refresh command signal Ext_Auto under the fuse or test mode conditions.

In more detail, as illustrated in FIG. 2b, the first controller 22 outputs the first internal auto-refresh command signal Auto 50% in response to the second counter signal CNTB_OUT when the first test mode signal TM_FUSE_enable<50%> is activated, and outputs the second internal auto-refresh command signal Auto 66% in response to the second counter signal CNTB_OUT when the second test mode signal TM_FUSE_enable<66%> is activated.

As illustrated in FIG. 2a, the reset section 21 outputs the reset signal to the counter unit 10 in response to the first and second counter signals CNTA_OUT and CNTB_OUT when the second test mode signal TM_FUSE_enable<66%> is activated. Such a reset section 21 controls the counter signal in order to generate the internal refresh command signal for skipping the refresh in response to a specific external refresh command signal.

As illustrated in FIG. 2c, the second controller 23 outputs the third internal auto-refresh command signal Auto 75% in response to the first and second counter signal signals CNTA_OUT and CNTB_OUT when the third test mode signal TM_FUSE_enable<75%> is activated.

According to the present invention as described above, the auto-refresh control apparatus controls the counter unit that outputs the first and second counter signal signals CNTA_OUT and CNTB_OUT whenever receiving the external auto-refresh command signal Ext_Auto, and generates the internal auto-refresh command signals Auto 50%, Auto 60% and Auto 75% in response to the counter signal signals CNTA_OUT and CNTB_OUT according to whether the test mode signals TM_FUSE_enable<50%, 66% and 75%> are activated, thereby periodically skipping the refresh.

Although examples and exemplary embodiments of the present invention have been described for illustrative purposes, those skilled in the art will appreciate that various modifications, additions and substitutions are possible, without departing from the scope and spirit of the invention as disclosed in the accompanying claims.

The present application claims priority to Korean patent application number 10-2007-0133637, filed on Dec. 18, 2007, the entire contents of which are incorporated herein by reference.

What is claimed is:

1. An auto-refresh control apparatus comprising:
    a counter unit configured to output counter signals in response to an external auto-refresh command signal;
    a first controller configured to output a first internal auto-refresh command signal in response to the counter signals when a first test mode signal is activated, and output a second auto-refresh command signal in response to the counter signals when a second test mode signal is activated; and
    a reset section for outputting a reset signal to the counter unit in response to one or more of the counter signals when the second test mode signal is activated.

2. The auto-refresh control apparatus of claim 1, wherein the counter unit includes:
    a first counter for outputting a first counter signal in response to the external auto-refresh command signal; and
    a second counter for outputting a second counter signal in response to the first counter signal.

3. The auto-refresh control apparatus of claim 1, wherein, when the external auto-refresh command signal is input to the refresh command signal generating unit, the first and second test mode signals are activated when a refresh period is set such that refreshes of 50% and 66% are performed, respectively.

4. The auto-refresh control apparatus of claim 1, wherein the first controller includes:
    an operating unit for performing a logic operation in response to the one or more of the counter signals;
    a first output unit for outputting an output signal of the operating unit when the first test mode signal is activated;
    a first buffer for buffering an output signal of the first output unit;
    a second output unit for outputting the output signal of the operating unit when the second test mode signal is activated; and
    a second buffer for buffering an output signal of the second output unit.

5. The auto-refresh control apparatus of claim 4, wherein the first and second output units include transfer gates that transfer the output signal of the operating unit in response to the first and second test mode signals, respectively.

6. The auto-refresh control apparatus of claim 1, wherein the reset section includes:
    an operating unit for performing a logic operation in response to the one or more of the counter signals;
    a latch section for latching an output signal of the operating unit;
    a buffer for buffering an output signal of the latch section;
    an output unit for outputting an output signal of the buffer when the second test mode signal is activated; and
    a pull-down driver for pull-down driving an output terminal of the operating unit in response to a power up signal.

7. The auto-refresh control apparatus of claim 6, wherein the output unit includes a transfer gate that transfers the output signal of the operating unit in response to the second test mode signal.

8. The auto-refresh control apparatus of claim 1, further comprising:
    a second controller configured to output a third internal auto-refresh command signal in response to the one or more of the counter signals when a third test mode signal is activated.

9. The auto-refresh control apparatus of claim 8, wherein, when the external auto-refresh command signal is input to the refresh command signal generating unit, the first to third test mode signals are activated when a refresh period is set such that refreshes of 50%, 66% and 75% are performed, respectively.

10. The auto-refresh control apparatus of claim 8, wherein the first controller includes:
    an operating unit for performing a logic operation in response to the one or more of the counter signals;
    a first output unit for outputting an output signal of the operating unit when the first test mode signal is activated;
    a first buffer for buffering an output signal of the first output unit;
    a second output unit for outputting the output signal of the operating unit when the second test mode signal is activated; and
    a second buffer for buffering an output signal of the second output unit.

11. The auto-refresh control apparatus of claim 10, wherein the first and second output units include transfer gates that transfer the output signal of the operating unit in response to the first and second test mode signals, respectively.

12. The auto-refresh control apparatus of claim 8, wherein the second controller includes:
    an operating unit for performing a logic operation in response to the one or more of the counter signals;
    an output unit for outputting an output signal of the operating unit when the third test mode signal is activated; and
    a buffer for buffering an output signal of the output unit.

13. The auto-refresh control apparatus of claim 12, wherein the output unit includes a transfer gate that transfers the output signal of the operating unit in response to the third test mode signal.

14. The auto-refresh control apparatus of claim 8, wherein the reset section includes:
    an operating unit for performing a logic operation in response to the one or more of the counter signals;
    a latch section for latching an output signal of the operating unit;
    a buffer for buffering an output signal of the latch section;
    an output unit for outputting an output signal of the buffer when the second test mode signal is activated; and
    a pull-down driver for pull-down driving an output terminal of the operating unit in response to a power up signal.

15. The auto-refresh control apparatus of claim 14, wherein the output unit includes a transfer gate that transfers the output signal of the operating unit in response to the second test mode signal.

16. The auto-refresh control apparatus of claim 1, wherein, when the external auto-refresh command signal is input N times, the test mode signal is activated when a refresh period is set such that refresh is skipped when a specific external auto-refresh command signal is input, wherein N is a natural number.

17. An auto-refresh control apparatus comprising:
   a counter unit for outputting counter signals in response to an external auto-refresh command signal;
   a first controller configured to output a first internal auto-refresh command signal in response to the counter signal when a first test mode signal is activated, and output a second auto-refresh command signal in response to the counter signals when a second test mode signal is activated,
   a second controller for outputting a third internal auto-refresh command signal in response to one or more of the counter signals when a third test mode signal is activated; and
   a reset section for outputting a reset signal to the counter unit in response to one or more of the counter signals when the second test mode signal is activated,
   wherein the refresh command signal generating unit changes an auto-refresh period in response to the test mode signal.

18. The auto-refresh control apparatus of claim 17, wherein the counter unit includes:
   a first counter for outputting a first counter signal in response to the external auto-refresh command signal; and
   a second counter for outputting a second counter signal in response to the first counter signal.

19. The auto-refresh control apparatus of claim 17, wherein, when the external auto-refresh command signal is input to the refresh command signal generating unit, the first test mode signal, the second test mode signal, and the third test mode signal are activated when a refresh period is set such that refreshes of 50%, 66% and 75% are performed, respectively.

20. The auto-refresh control apparatus of claim 17, wherein the first controller includes:
   an operating unit for performing a logic operation in response to the one or more of the counter signals;
   a first output unit for outputting an output signal of the operating unit when the first test mode signal is activated;
   a first buffer for buffering an output signal of the first output unit;
   a second output unit for outputting the output signal of the operating unit when the second test mode signal is activated; and
   a second buffer for buffering an output signal of the second output unit.

21. The auto-refresh control apparatus of claim 17, wherein the second controller includes:
   an operating unit for performing a logic operation in response to the one or more of the counter signals;
   an output unit for outputting an output signal of the operating unit when the third test mode signal is activated; and
   a buffer for buffering an output signal of the output unit.

22. The auto-refresh control apparatus of claim 17, wherein the reset section includes:
   an operating unit for performing a logic operation in response to the one or more of the counter signals;
   a latch section for latching an output signal of the operating unit;
   a buffer for buffering an output signal of the latch section;
   an output unit for outputting an output signal of the buffer when the second test mode signal is activated; and
   a pull-down driver for pull-down driving an output terminal of the operating unit in response to a power up signal.

23. The auto-refresh control apparatus of claim 17, wherein, when the external auto-refresh command signal is input N times, the test mode signal is activated when a refresh period is set such that refresh is skipped when a specific external auto-refresh command signal is input, wherein N is a natural number.

* * * * *